United States Patent [19]
Okamura

[11] Patent Number: 5,894,442
[45] Date of Patent: Apr. 13, 1999

[54] SEMICONDUCTOR MEMORY DEVICE EQUIPPED WITH AN EQUALIZING CONTROL CIRCUIT HAVING A FUNCTION OF LATCHING AN EQUALIZING SIGNAL

[75] Inventor: Junichi Okamura, Yokohama, Japan

[73] Assignee: Kabushiki Kaisha Toshiba, Kawasaki, Japan

[21] Appl. No.: 08/805,614

[22] Filed: Feb. 26, 1997

[30] Foreign Application Priority Data

Feb. 27, 1996 [JP] Japan ................... 8-039648

[51] Int. Cl.⁶ .................................................. G11C 7/00
[52] U.S. Cl. ........................... 365/203; 365/230.08
[58] Field of Search ........................ 365/203, 230.08

[56] References Cited

U.S. PATENT DOCUMENTS

| | | | |
|---|---|---|---|
| Re. 35,750 | 3/1998 | Casper | 365/203 |
| 4,969,125 | 11/1990 | Ciraula | 365/203 |
| 5,475,642 | 12/1995 | Taylor | 365/203 |
| 5,625,598 | 4/1997 | Oba | 365/203 |
| 5,640,363 | 6/1997 | Furutani et al. | 365/203 |

*Primary Examiner*—A. Zavabian
*Attorney, Agent, or Firm*—Banner & Witcoff, Ltd.

[57] ABSTRACT

The present invention relates to a semiconductor memory device which, while preventing an operation error, achieves the shortening of a precharging time and, hence, further shortening of a cycle time of a memory operation. The equalizing control circuit includes a latch circuit. An equalizing control circuit receives a signal WLact and a signal X-ADR from a predecoder and outputs an equalizing signal EQS from these two signals. A latch circuit in the equalizing control circuit is set (the inactivation of an equalizing signal) by a signal X-ADR which is activated with an internal RAS signal and holds its state. The latch circuit is reset (the activation of the equalizing signal) by a signal corresponding to a word line active signal WLact with a word line inactivated. By doing so, it is possible to provide the equalizing control circuit not directly depending upon the internal RAS signal.

16 Claims, 5 Drawing Sheets

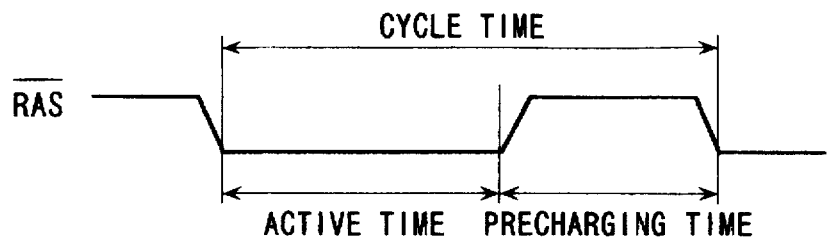
F I G. 1
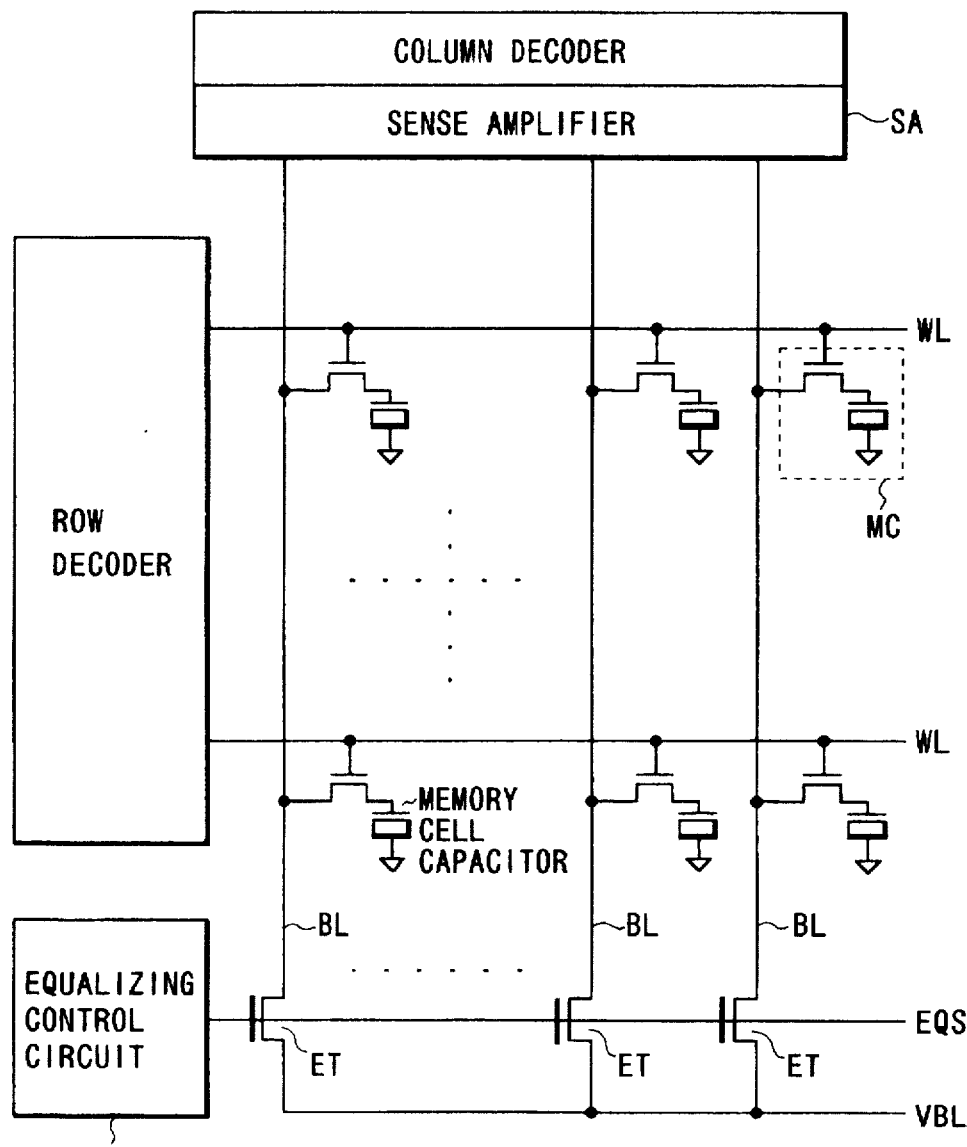
F I G. 2

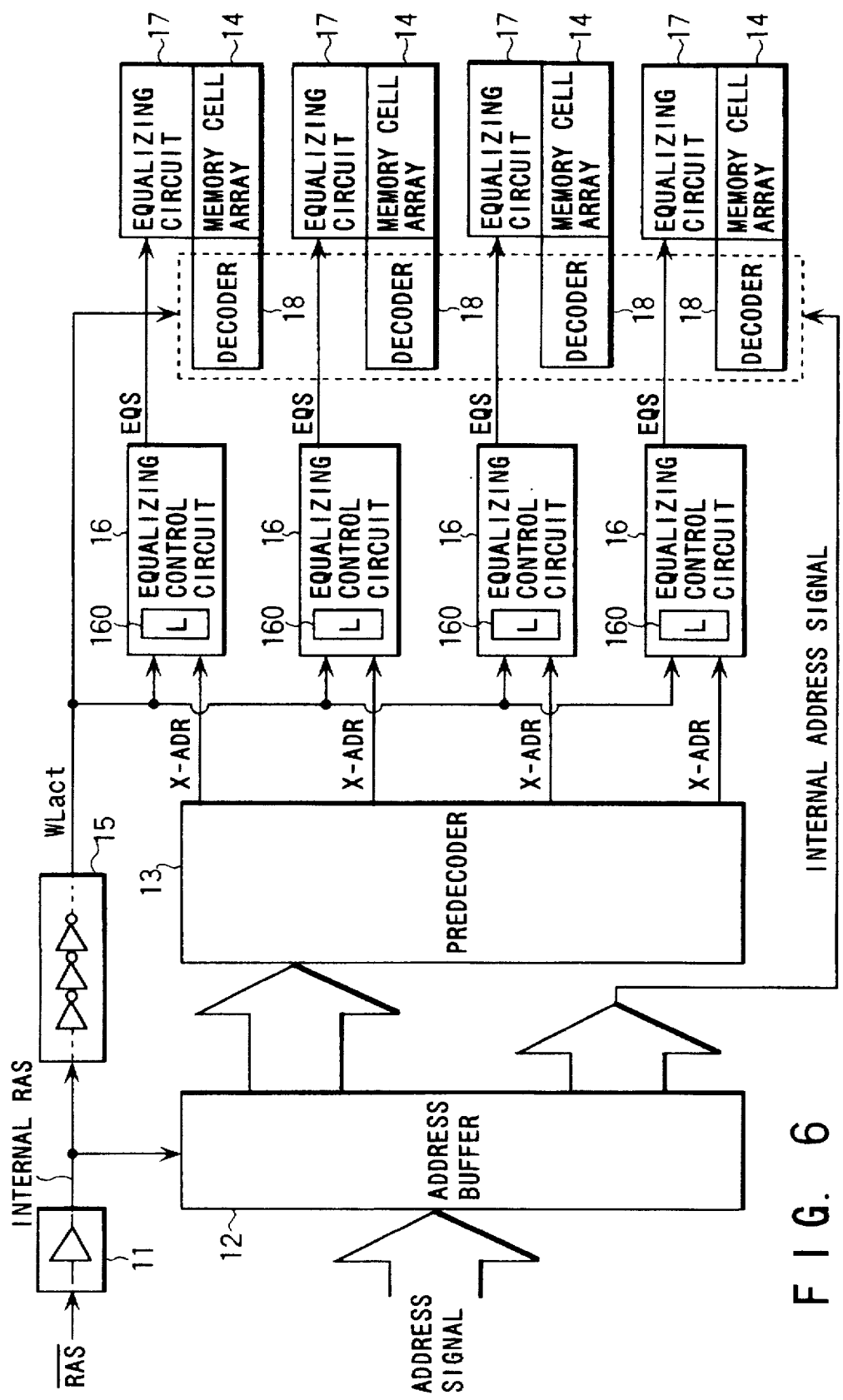
F I G. 6

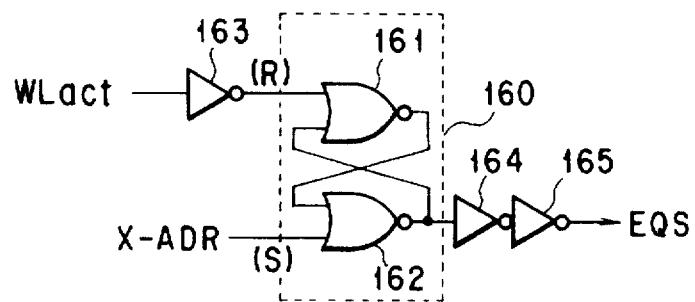
F I G. 7
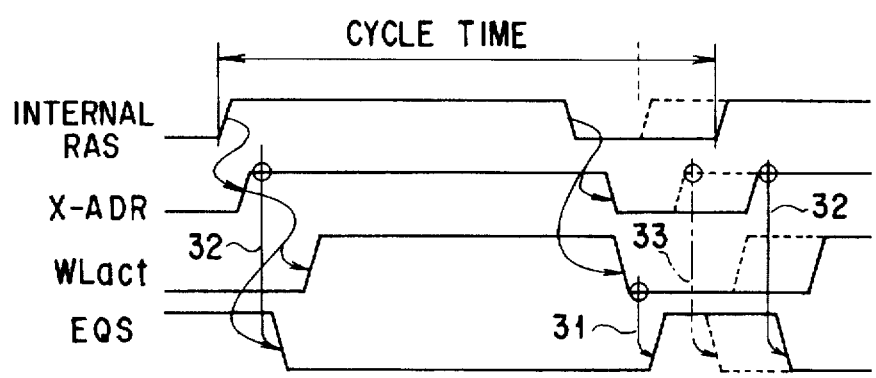
F I G. 8
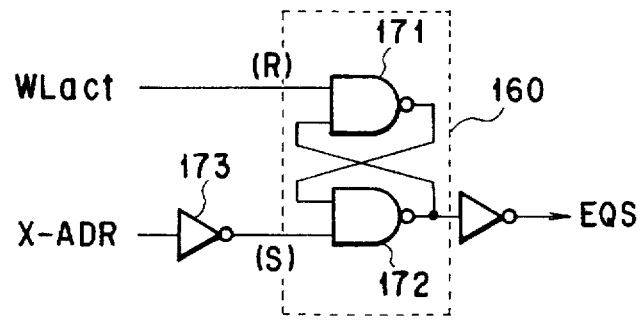
F I G. 9
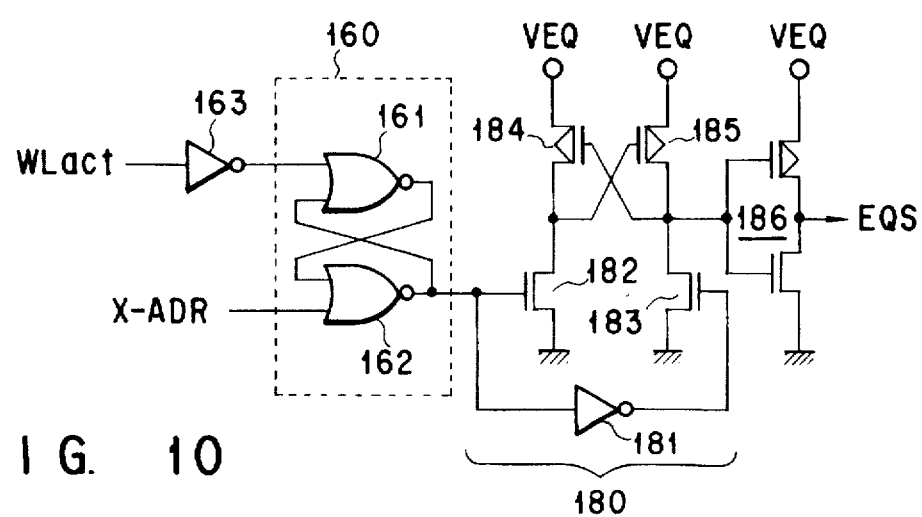
F I G. 10

SEMICONDUCTOR MEMORY DEVICE EQUIPPED WITH AN EQUALIZING CONTROL CIRCUIT HAVING A FUNCTION OF LATCHING AN EQUALIZING SIGNAL

BACKGROUND OF THE INVENTION

The present invention relates to a semiconductor memory device including an equalizing circuit fitted to shorten a memory cycle time in particular.

In recent years, there has been a growing demand for achieving the high performance of a dynamic memory device and a stricter demand for the shortening of its cycle time in particular. As shown in FIG. 1, the cycle time of the dynamic memory device is defined by a minimal requisite active time plus a minimal requisite precharging time. How these two should be shortened has been a technical task to be achieved.

Further shortening of the minimal requisite active time of the above-mentioned cycle time also means the shortening of an access time of the memory device and many systems have conventionally been designed to achieve this task.

On the other hand, attempts to further shorten the minimal requisite precharging time of the cycle time have currently attracted not too much attention in spite of its importance the same as the former task.

FIG. 2 is a block circuit diagram showing a major section of an ordinary DRAM including equalizing transistors. Generally, the precharging time of the dynamic memory device is set in a manner as will be set out below. That is, the precharge time is set with a time from a "write level" (generally a voltage level determining a "0" or a "1" logical level) state, that is, a state in which a bit line BL is placed by the restoring (rewriting) operation of a sense amplifier SA after information (data) of a given memory cell MC has been read onto that bit line BL, to a state in which the bit line level is balanced to a given potential VBL, by the operation of an equalizing transistor ET, with a word line set in a read-ready state, that is, in an inactivated state (a row decoder set in the inactivated state) in which case the word line controls the transfer gate of the memory cell. The equalizing transistor ET is ON-controlled by an equalizing signal EQS from an equalizing control circuit EC.

In the above-mentioned ready state, the controlling of the equalizing transistor may be achieved by an equalizing signal for satisfying a predetermined time with which the bit line level is balanced through the equalizing signal. In actual practice, however, a longer time than the predetermined time is set as the precharging time, the reason of which will be given below.

FIG. 3 is a block circuit diagram showing an outline of the conventional semiconductor memory device. A RAS buffer 11 receives an external $\overline{RAS}$ signal (low active signal), and produces an internal signal (internal RAS signal). Upon receipt of the internal RAS signal an address buffer 12 supplies an externally received address signal to a predecoder 13. The predecoder 13 produces a signal X-ADR corresponding to the address signal. The signal X-ADR is used to select a corresponding one of divided memory cell arrays 14 which includes a cell to be accessed. A delay circuit 15 is so arranged as to control a decode timing of each word line and the internal RAS signal is such that it is delayed until column-based control becomes stable. The output of the delay circuit 15 emerges as a word line active signal WLact for controlling the activation/inactivation of the word line.

An equalizing control circuit 80 corresponds to the equalizing control circuit EC in FIG. 2. The equalizing control circuit 80 receives the internal RAS signal, signal WLact and signal X-ADR. The equalizing control signal EQS controls an equalizing circuit 17. The equalizing circuit 17 includes equalizing transistors, as shown in FIG. 2, to set a given potential on the bit line in a balanced state. The equalizing transistors are ON-controlled by the equalizing signal EQS. After the equalization is effected by the equalizing transistors, a predetermined voltage is applied to a control node (the gate of the transistors of associated memory cells MC) of the associated memory cells on a selected one of respective rows (word lines WL) and the transfer node of those memory cells on a selected one of those associated columns (bit line BL) is activated to allow a transfer of data signals into and out of the memory cell array.

Of the row-and column-base decoder 18, the row-base decoder 18 alone is shown as a block diagram. Through the activation of the word line active signal WLact, the divided memory cell array 14 to be activated is selected in accordance with the received internal address signal and a decoding operation is performed.

FIG. 4 is a circuit diagram showing a conventional arrangement of the above-mentioned equalizing control circuit 80 and FIG. 5 shows a timing chart relating to the circuit operation of FIG. 4. Here, the cycle time is such that RAS (internal RAS) in the memory corresponds to the external $\overline{RAS}$ (low active).

The equalizing control circuit of FIG. 4 will be explained below with reference to FIG. 5. A NOR gate 81 receives a signal WLact and internal RAS signal as two input signals and an AND gate 83 receives an inverted replica of an output signal of the NOR gate 81 via an inverter 82 and a signal X-ADR as two input signals and, through this combination logical array, an output signal of the AND gate 83 is passed through series-connected inverters 84 and 85 to provide an equalizing signal EQS.

That is, an equalizing operation is inactivated with the signal X-ADR and internal RAS signal both in the states (87) as shown in FIG. 5 and the equalizing operation is activated with the internal RAS signal set in an inactivated (low level signal) state (88) and the word line active signal set in a low level signal state (88) as shown in FIG. 5 so that the corresponding memory cell may be inactivated.

In the above-mentioned arrangement, in order to perform the equalizing operation, both a condition under which the word line active signal is set in the inactivated (low level) state to allow the word line to be inactivated and a condition under which the internal RAS signal is set in the inactivated (low level) state have to be satisfied and, once these conditions are satisfied, an equalizing operation is started.

In the arrangement as set out above, if the precharging time is set shorter on the memory device as indicated, for example, in FIG. 5, an equalizing operation to be performed originally from an inactivated state in which the word line is set is not done because the internal RAS signal has already been set, at that time, to an activated state and, hence, no proper logic is taken between the two (89).

In the prior art, in order to achieve further shortening of the precharging time, it may be possible to perform an adequate equalizing operation by activating an equalizing signal until a word line is activated and, in spite of this fact, the above-mentioned case is such that the equalizing signal is prepared from such a combination logic circuit arrangement, there being a risk that an equalizing signal will not be obtained adequately. Therefore, there is room for further improvement.

BRIEF SUMMARY OF THE INVENTION

It is accordingly the object of the present invention to provide a semiconductor memory device which, while maintaining the reliability, can achieve the shortening of a precharging time and further shortening of a cycle time of a memory operation.

The object of the present invention is achieved by the following specific arrangement.

The semiconductor memory device of the present invention includes an equalizing circuit, responsive to an equalizing signal prior to activating the memory cell array, for balancing potential levels on a plurality of data lines for transferring a data signal into and out of a memory array and an equalizing signal control circuit including latch means for controlling the equalizing signal.

According to the present invention, the equalizing signal control circuit includes latch means for allowing the equalizing signal to be set to an inactivated state in accordance with an address signal input to the memory cell array and to be reset to an activated state in accordance with the inactivation of, for example, a word line with the activation of the memory cell array.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a waveform diagram showing a cycle time of a dynamic memory device;

FIG. 2 is a block circuit diagram showing a major section of an ordinary DRAM including equalizing transistors;

FIG. 6 is a block circuit diagram showing an arrangement of a semiconductor memory device according to the present invention;

FIG. 7 is a circuit diagram showing a first practical form of a major section of FIG. 6;

FIG. 8 is a timing chart relating to the circuit operation of FIG. 6;

FIG. 9 is a circuit arrangement of a second practical form of a major section in FIG. 6; and FIG. 10 is a circuit arrangement of a third practical form of a major section in FIG. 6.

DETAILED DESCRIPTION OF THE INVENTION

Figure 3:
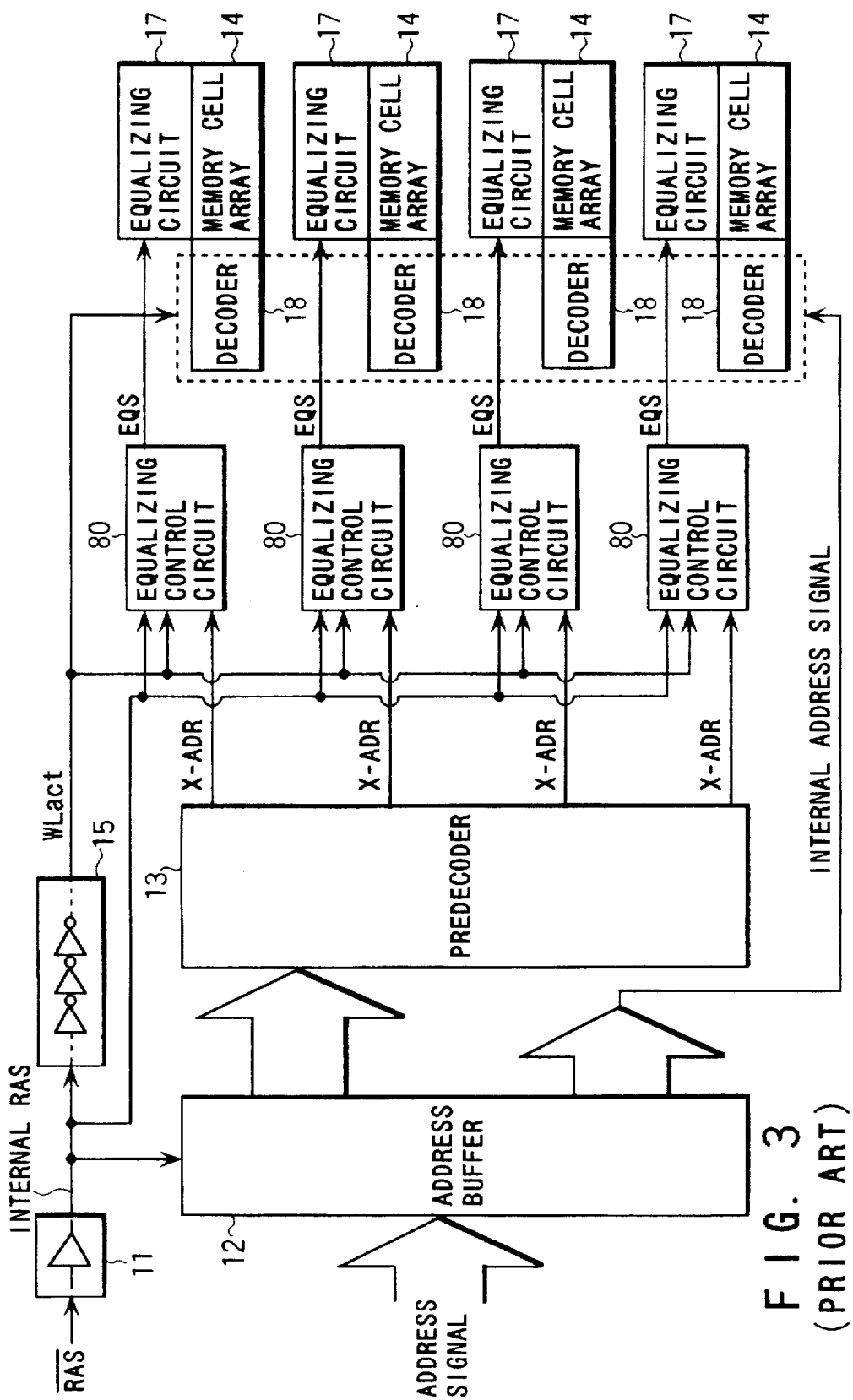
FIG. 3 is a block circuit diagram showing an arrangement of a conventional semiconductor device.
Figure 4:
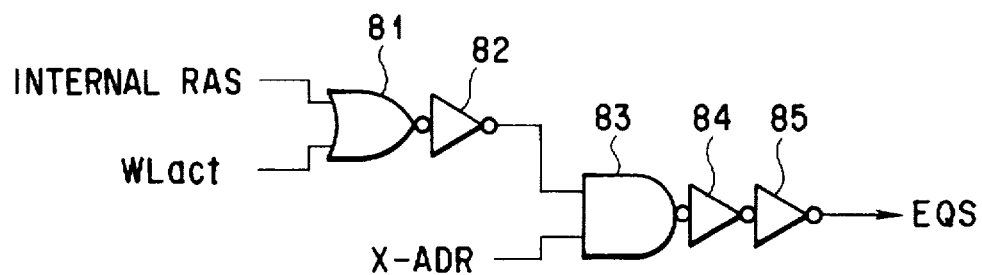
FIG. 4 is a circuit diagram showing a conventional arrangement of an equalizing control circuit in FIG. 3 which controls equalizing transistors.
Figure 5:
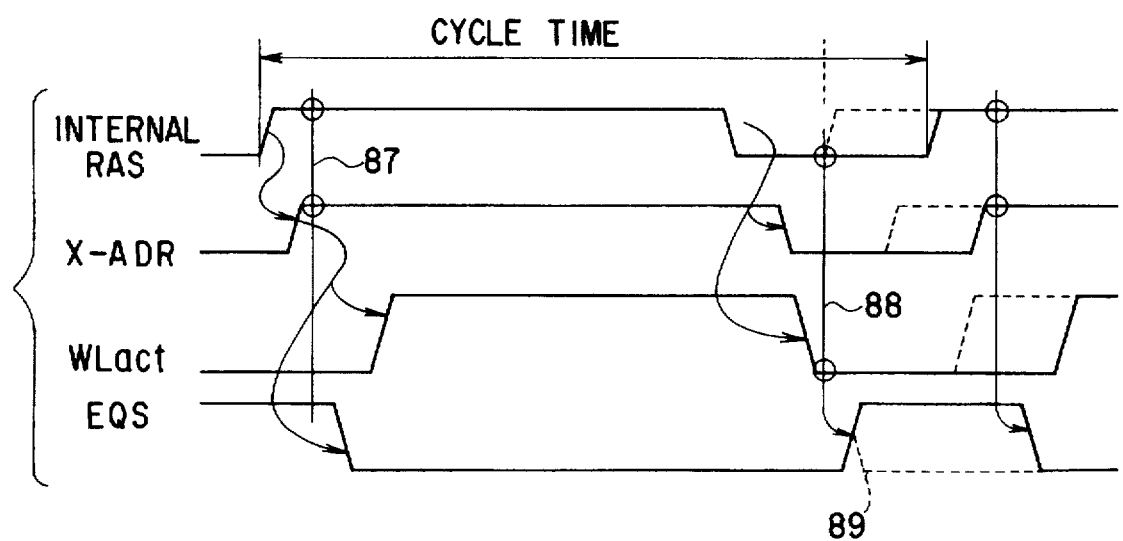
FIG. 5 is a timing chart relating to the circuit operation of FIG. 4.

FIG. 6 is a circuit block diagram showing an outline of a semiconductor memory device according to the present invention. A RAS buffer 11 receives an external $\overline{RAS}$ (low active) signal and produces an internal RAS signal. Upon receipt of the internal RAS signal an address buffer 12 sends an address signal which is received from an external source to a predecoder 13. The predecoder 13 produces a signal X-ADR corresponding to the address signal. The signal X-ADR is prepared by decoding the address signal input from the external source and is used to select, from divided memory cell arrays 14, a memory cell array including a cell to be accessed.

A delay circuit 15 is so constructed as to control a decode timing of a word line and to delay the internal RAS signal until column-base control becomes stabilized. That is, it secures a time from an activated state in which a bit line as shown in FIG. 2 is set through the connection of the bit line to an equalizer-base circuit, etc., to its inactivated state. The output of the delay circuit 15 provides a word line active signal Wact for controlling the activation/inactivation of the word line.

From the low dissipation current requirement the current dynamic memory device has generally a memory cell array structure to be operated in divided units. That is, for each divided memory cell array, for example, an equalizing control circuit needs to have a corresponding memory cell array unit.

The equalizing control circuit 16 receives the corresponding signal X-ADR from the predecoder 13 and a signal WLact. The equalizing control circuit 16 includes a latch circuit 160 and the latch 160 outputs an equalizing control signal EQS from its two input states. The equalizing control signal EQS controls an equalizing circuit 17.

Of row-and column-base decoders 18, the row-base decoder 18 alone is shown as a block diagram. With the word line active signal WLact set in an activated state the memory cell array 14 to be activated is selected in accordance with a received internal address signal and a corresponding decoding operation is performed.

The equalizing circuit 17 has, as shown in FIG. 2, an equalizing transistor for setting the bit line potential in a balanced state and the equalizing transistors are ON-controlled by the equalizing signal EQS. After the equalization is performed by the equalizing transistor, a given voltage is applied to a control node of the memory cell (the gate of the transistor of a memory cell MC) on a selected one of rows (word lines WL) and a transfer node of the memory cell is activated on a selected one of columns (bit lines BL) to allow a data signal to be transferred into and out of the memory array.

The latch circuit 160 in the equalizing control circuit 16 is set (the equalizing signal is inactivated) by the signal X-ADR activated with the internal RAS signal inactivated and holds its state. The resetting of the latch circuit 160 (the activation of the equalization) is achieved by a signal which is output with the inactivation of the word line by the word line active signal WLact.

If a precharging time of a minimal requisite active time plus a minimal requisite precharging time deciding a cycle time of the dynamic memory device is shortened, there occurs no problem as set out above, that is, there is no need for worry that, from the inactivation of the word line, a subsequent equalizing operation will be impossible because, at that time, the internal RAS signal has already been activated. It is, therefore, not possible to effect control directly depending upon the internal RAS signal.

FIG. 7 is a circuit diagram showing a first practical form of the equalizing control circuit 16 in FIG. 6. The latch circuit 160 in the equalizing control circuit 16 has two cross-coupled NOR gates 161 and 162 in their input/output relation to provide a flip-flop circuit. In this latch circuit, a set input corresponds to the signal X-ADR and a reset input corresponds to an inverted replica of a word line active signal via an inverter 163. The output of the flip-flop is connected to two series-connected inverters 164 and 165 to provide an equalizing signal EQS.

FIG. 8 is a timing chart relating to the circuit operation of FIG. 7. Here, the cycle time is such that an external $\overline{RAS}$ (low active) corresponds to an internal RAS (RAS in memory).

In the timing chart shown in FIG. 8 an equalizing operation activating time is defined at an inactivated level of the word line active signal WLact (31) and an equalizing operation inactivating time is defined at an activating level of the signal X-ADR corresponding to the address signal (32).

In the arrangement above, for example, in the memory device, there is an ample precharging time and, even if it is set shorter as indicated by a broken line, the control of the equalizing signal EQS does not directly depend upon the internal RAS signal. In consequences, the signal EQS is positively activated (high level) by the signal WLact (31) and, after a lapse of a predetermined time, positively inactivated (low level) by the signal X-ADR corresponding to the address signal (33). That is, if the above-mentioned predetermined time satisfies a time required for equalization, it is possible to achieve the shortening of the precharging time without lowering the reliability.

FIG. 9 is a circuit diagram showing a second practical form of the equalizing control circuit 16 in FIG. 6. A latch circuit 160 in the equalizing control circuit 16 is comprised of a flip-flop with two NAND gates 171 and 172 cross-coupled in their input and output relation as shown in FIG. 9. In the flip-flop above, the set input constitutes an inverted replica of the signal X-ADR via an inverter 173 and the reset input constitutes a word line active signal WLact. The output of the flip-flop provides an equalizing signal EQS via an inverter 174. This arrangement ensures the same advantage as in FIG. 7.

FIG. 10 is a circuit diagram showing a third practical form of the equalizing control circuit 16 in FIG. 6. This arrangement comprises a latch circuit the same as that in FIG. 7 and a level shift circuit 180 added to the latch circuit. The outputs of the complementary flip-flop are connected one to an N channel MOS transistor 182 and one connected to an N channel MOS transistor 183 via an inverter 181. P channel MOS transistors 184 and 185 have their current paths connected between the drains of the transistors 183 and 184 and a level shift voltage supply VEQ. The gate of the P channel MOS transistor 184 is connected to the drain of the N channel MOS transistor 183 and the gate of the P channel MOS transistor 185 to the drain of the N channel MOS transistor 182. The drains of the transistors 183 and 185 are connected to an input node of a CMOS inverter 186 connected to the level shift voltage supply VEQ. The output of the CMOS inverter 186 provides an equalizing signal EQS.

The level shift circuit 180 is provided in the case where an external power supply voltage is lower than the operation power supply voltage. By doing so, the equalizer signal is level shifted to handle the equalizing operation. This arrangement also ensures the same effect as in FIG. 7.

Various changes or modifications of the equalizing control circuit including the latch circuit may be made as shown, for example, in the practical forms as shown in FIGS. 7, 9 and 10. The equalizing signal EQS in FIG. 10 is opposite in logic to those in FIGS. 7 and 9. Where the respective signals are so inverted or the different logic levels are used between respective signals, the corresponding changes or modifications can be made and the addition of a different level shift can be done without departing from the essence of the equalizing control circuit of the present invention.

The arrangement of the equalizing circuit may be variously changed or modified. Although the equalizing transistor ET of FIG. 2 has been explained in conjunction with the single bit line, if use is made of paired bit lines, it is needless to say that the equalizing circuit is so configured as to include equalizing transistors for achieving equalization with a proper potential set on the paired bit lines.

According to the present invention, it is expected that the cycle time can be made about 2 to 3 ns on a 64 Mbit DRAM for example. That is, there is no need for worry that, from the inactivation of the word line, a subsequent equalizing operation will be impossible because, at that time, the internal RAS signal has already been activated. If there is an allowance of the equalizing operation itself, then it is possible to shorten the time by that extent without adversely affecting the reliability.

According to the present invention, a semiconductor memory device is provided which, in place of providing the conventional logic circuit configuration, has an equalizing signal control circuit including a latch means and, hence, has a control circuit arrangement not directly depending upon an internal RAS signal and, while maintaining the reliability, can achieve the shortening of a precharging time and hence further shortening of a cycle time of a memory operation.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

I claim:

1. A semiconductor memory device comprising:

a memory cell array activated to select at least one memory cell, said memory cell array comprising dynamic memory cells requiring a restoring operation;

a plurality of bit lines connected to said dynamic memory cells for allowing a data signal to be transferred into and out of said memory cell array;

an equalizing circuit, responsive to an equalizing signal prior to activating said memory cell array, for balancing a potential level on said bit lines; and an equalizing signal control circuit including a latch circuit for controlling the equalizing signal, the equalizing signal being set to an activating level responsive to an inactivation level of a word line active signal for controlling decode timing of word lines and to a non-activating level responsive to a signal corresponding to an inputting of an address signal for selecting said memory cell.

2. A semiconductor memory device comprising:

a memory cell array having a plurality of memory cells arranged in a row and column matrix array;

a plurality of word lines connected to control nodes of the memory cells in corresponding rows of said memory cell array, said word lines being activated upon being supplied with predetermined voltage, a plurality of bit lines connected to transfer nodes of the memory cells in corresponding columns of said memory cell array to allow a data signal to be transferred into and out of the memory cell array;

equalizing transistors electrically connected between a predetermined number of said bit lines and a predetermined potential node, said equalizing transistors equalizing potential levels on said bit lines prior to the activation of said word lines; and an equalizing signal control circuit, equipped with a latch circuit, for controlling an equalizing signal supplied to gates of said equalizing transistors, the equalizing signal being set to an activation level responsive to an inactivation level of a word line active signal for controlling decode timing of said word lines and to a non-activation level responsive to the inputting of an address signal for selecting one of said memory cells.

3. The semiconductor memory device according to claim 2, wherein the equalizing signal control circuit includes a level shift circuit.

4. A semiconductor memory device comprising:

a memory cell array having a plurality of memory cells arranged in a row/column matrix;

a plurality of word lines connected to control nodes of the memory cells in corresponding rows of said memory cell array;

a plurality of bit lines connected to transfer nodes of the memory cells in corresponding columns of said memory cell array to allow a data signal to be transferred into and out of said memory cell array;

equalizing transistors electrically connected between a predetermined number of said bit lines and predetermined potential node, said equalizing transistors equalizing potentials of said bit lines when said memory cell array is inactivated; and an equalizing signal control circuit for allowing an equalizing signal which is applied to gates of said equalizing transistors to be in an activated state in accordance with an inactivation level of a word line active signal for controlling decode timing of said word lines and to be in a non-activated state in accordance with an address signal corresponding to an external signal which is directed to said memory cell array.

5. The semiconductor memory device according to claim 4, wherein the equalizing signal control circuit includes a level shift circuit.

6. The semiconductor memory device according to claim 2 or 4, wherein the memory cell array is divided into blocks and only a predetermined memory cell array block is activated in accordance with the address signal.

7. A semiconductor memory device comprising:

a plurality of memory cell arrays each having a plurality of memory cells in a row/column matrix array, said memory cell arrays comprising dynamic memory cells requiring a restoring operation;

a plurality of word lines connected to control nodes of the memory cells in corresponding rows of said memory cell arrays and being activated upon being supplied with a predetermined voltage;

a plurality of bit lines connected to transfer nodes of the memory cells in corresponding columns of said memory cell arrays to allow a data signal to be transferred into and out of said memory cell array;

equalizing transistors electrically connected between a predetermined number of said bit lines and a predetermined potential node; and equalizing signal control circuits each provided for a corresponding one of said memory cell arrays, and equipped with a flip-flop for allowing an equalizing signal which is applied to gates of said equalizing transistors to be in an activated state in accordance with an inactivation level of a word line active signal for controlling decode timing of said word lines and to be made to a non-activated state in accordance with an address signal corresponding to an external signal which is directed to one of said memory cell arrays.

8. The semiconductor memory device according to claim 7, wherein the equalizing signal control circuit includes a level shift circuit.

9. The semiconductor memory device according to claim 7 or 8, wherein the memory cell array is divided into blocks and only a predetermined memory cell array block is activated in accordance with the address signal.

10. A semiconductor memory device including a flip-flop circuit for controlling equalizing circuitry for, prior to activating a memory cell array, balancing potential levels on a plurality of bit lines for transferring a signal into and out of said memory cell array in which said flip-flop circuit allows said equalizing circuitry to be activated in accordance with an inactivation level of a word line active signal for controlling decode timing of word lines and to be non-activated in accordance with an address signal corresponding to an external signal which is directed to said memory cell array.

11. A semiconductor memory device comprising:

a memory cell array comprising memory cells arranged in rows and columns;

bit lines coupled to the memory cells in the columns of said memory cell array;

word lines coupled to the memory cells in the rows of said memory cell array;

equalizing circuitry for equaling potentials of said bit lines; and equalizing control circuitry for generating an equalizing signal supplied to said equalizing circuitry, said equalizing control circuitry comprising a latch circuit which is set to generate a signal for deactivating said equalizing circuitry based on a first signal generated in response to an address signal for selecting said memory cells, and which is reset to generate a signal for activating said equalizing circuit based on a second signal generated in response to an inactivation level of a word line active signal for controlling decode timing of said word lines.

12. The semiconductor memory device according to claim 11, wherein said latch circuit comprises a flip-flop.

13. The semiconductor memory device according to claim 11, wherein said equalizing control circuitry further comprises a level-shift circuit.

14. The semiconductor memory device according to claim 11, wherein said equalizing circuitry comprises equalizing transistors connected between said bit lines and a potential node, the equalizing control signal being supplied to control terminals of said equalizing transistors.

15. The semiconductor memory device according to claim 11, wherein said memory cells comprise dynamic memory cells.

16. A semiconductor memory device comprising:

a plurality of memory cell arrays activated to select at least one memory cell, said memory cell arrays comprising dynamic memory cells requiring a restoring operation;

a plurality of bit lines connected to said dynamic memory cells for allowing a data signal to be transferred into and out of said memory cell arrays;

equalizing circuits, responsive to an equalizing signal prior to activating said memory cell arrays for balancing a potential level on said bit lines; and equalizing signal control circuits each provided for a corresponding one of said memory cell arrays, and including a latch circuit for controlling the equalizing signal, the equalizing signal being set to an activating level responsive to an inactivation level of a word line active signal for controlling decode timing of word lines and to a non-activating level responsive to a signal corresponding to an inputting of an address signal for selecting said memory cell.

* * * * *